United States Patent
Tzu et al.

[11] Patent Number: 6,001,512
[45] Date of Patent: Dec. 14, 1999

[54] METHOD OF BLIND BORDER PATTERN LAYOUT FOR ATTENUATED PHASE SHIFTING MASKS

[75] Inventors: San-De Tzu, Taipei; Yi-Hsu Chen, Hsin-Chu, both of Taiwan

[73] Assignee: Taiwan Semiconductor Manufacturing Company Ltd., Hsin-Chu, Taiwan

[21] Appl. No.: 09/069,459

[22] Filed: Apr. 28, 1998

[51] Int. Cl.[6] .................................................. G03F 9/00
[52] U.S. Cl. .................................................. 430/5; 430/22
[58] Field of Search ........................... 430/5, 22; 355/53; 356/400

[56] References Cited

U.S. PATENT DOCUMENTS

| | | | |
|---|---|---|---|
| 5,446,521 | 8/1995 | Hainsey et al. | 355/53 |
| 5,537,648 | 7/1996 | Liebmann et al. | 395/500 |
| 5,565,286 | 10/1996 | Lin | 430/5 |
| 5,620,816 | 4/1997 | Dao | 430/5 |
| 5,644,381 | 7/1997 | Miyazaki et al. | 355/53 |

OTHER PUBLICATIONS

"ULSI Technology" by CM Chang and SM. Sze, McGraw–Hill Companies, 1996, pp. 284–289

*Primary Examiner*—S. Rosasco
*Attorney, Agent, or Firm*—George O. Saile; Stephen B. Ackerman; Larry J. Prescott

[57] ABSTRACT

A mask and method of systematically laying out the mask for test patterns in the frame cell region of an attenuating phase shifting mask are described. An array of sub-resolution contact holes are used in the border regions of the mask to prevent over exposure of photoresist in the regions between the device regions on a wafer due to side lobe effect. The mask and method provide for a buffer distance surrounding the features of the test patterns. The buffer distance is free of sub-resolution contact holes. When the buffer distance is correctly chosen problems due to side lobe effect at the frame cell portion of the mask are prevented.

20 Claims, 6 Drawing Sheets

METHOD OF BLIND BORDER PATTERN LAYOUT FOR ATTENUATED PHASE SHIFTING MASKS

BACKGROUND OF THE INVENTION (1) Field of the Invention

This invention relates to attenuating phase shifting masks and more particularly to the location and formation of sub-resolution contact holes around test patterns formed in the frame cell region of the mask border.

(2) Description of the Related Art

TSMC-96-293, Ser. No. 08/857,166 now U.S. Pat. No. 5,817,439, Filed May 15, 1997, entitled "A NEW METHOD OF BLIND BORDER PATTERN LAYOUT FOR ATTENUATED PHASE SHIFTING MASKS", and assigned to the same assignee describes a method of locating sub-resolution contact holes in the border region of attenuating phase shifting masks.

"ULSI Technology", by C. M. Chang and S. M. Sze, McGraw-Hill Companies, 1996, pages 284–289 describes a method of forming an attenuating phase shifting mask.

U.S. Pat. No. 5,446,521 to Hainsey et al. describes an attenuating phase shifting mask using a sub-resolution pattern of lines and spaces in the scribeline part of the mask pattern.

U.S. Pat. No. 5,565,286 to Lin describes a structure and fabrication method for a phase shifting mask using an attenuating phase shifting mask structure combined with an alternating element phase shifting structure.

U.S. Pat. No. 5,620,816 to Dao describes method of mask layout wherein device features are placed on lines and/or columns. The lines and/or columns are extracted from a database.

U.S. Pat. No. 5,644,381 to Miyazaki et al. describes a method of exposing a wafer using an attenuating phase shifting mask. An optimum focal position is determined so that a resist film having a step on its surface can be exposed with high precision.

U.S. Pat. No. 5,537,648 to Liebmann et al. describes a method for automatically generating phase shifted mask designs implemented in a CAD program.

This invention describes a mask and method of mask layout for automatically forming a test pattern in a frame cell region of an attenuating phase shifting mask. The mask incorporates a buffer distance between the test pattern features and sub-resolution contact holes used to prevent side lobe effects in the regions between device regions of the mask. By using the proper buffer distance problems due to side lobe effect at the frame cell region of the mask, where the test pattern is located, are prevented.

SUMMARY OF THE INVENTION

Mask patterns formed with attenuating phase shifting material are frequently used in the manufacture of integrated circuit wafers. One of the problems encountered using attenuating phase shifting masks is the side lobe effect at the border regions between adjacent device regions on the wafer and especially the regions at the corners of the device regions. FIG. 1 shows a top view of a section of a wafer having device regions 12, border regions 14, and frame cell regions 16. Because the patterns are formed on the wafer using an attenuating phase shifting mask and a stepper the border regions 14 between adjacent device regions 12 are exposed twice and the corner regions 15 at the corners of the device regions 12 are exposed four times. When using conventional attenuating phase shifting masks the border regions 14 and the corner regions 15 of the mask are attenuating phase shifting material and the transmitted light intensity is reduced but is greater than zero and the multiple exposures in the border regions 14 and corner regions 15 cause side lobe effects.

In order to reduce the light transmittance at the border regions 14 and corner regions sub-resolution contact holes 20 are formed in the attenuating phase shifting material at the mask borders and mask corners, as can be seen in FIG. 2. The contact holes are sub-resolution contact holes and are too small to be resolved when the pattern is projected onto the wafer but they create interference patterns. These interference patterns effectively reduce the light transmitted by the border and corner regions and the problems due to the double and fourfold exposure at the mask borders and corners is greatly reduced. The contact hole size and pitch are chosen to minimize the light transmission in the mask border region.

As shown in FIG. 2, frame cells 16 are also located in the border regions 14. Informational patterns and test patterns, such as a box in box patterns, vernier patterns, test line patterns, critical dimension patterns, alphanumeric patterns and the like are located in the frame cells 16. The frame cells can cause side lobe problems because they disturb the pitch of the contact holes 20 causing the contact holes to lose their effectiveness in the vicinity of the frame cells.

It is a principle objective of this invention to provide a method of determining the layout of test patterns in frame cells which maintains the effectiveness of the sub-resolution contact holes and avoids the side-lobe problem.

It is another principle objective of this invention to provide a method of achieving a mask pattern layout which maintains the effectiveness of the sub-resolution contact holes in the vicinity of the frame cells and avoids the side-lobe problem.

It is another principle objective of this invention to provide a mask pattern layout which maintains the effectiveness of the sub-resolution contact holes in the vicinity of the frame cells and avoids the side-lobe problem.

These objectives are achieved by forming a buffer distance between the test pattern features in the frame cell and the sub-resolution contact holes. When the buffer distance is properly chosen the effectiveness of the sub-resolution contact holes is maintained.

DESCRIPTION OF THE PREFERRED EMBODIMENTS

Figure 1:
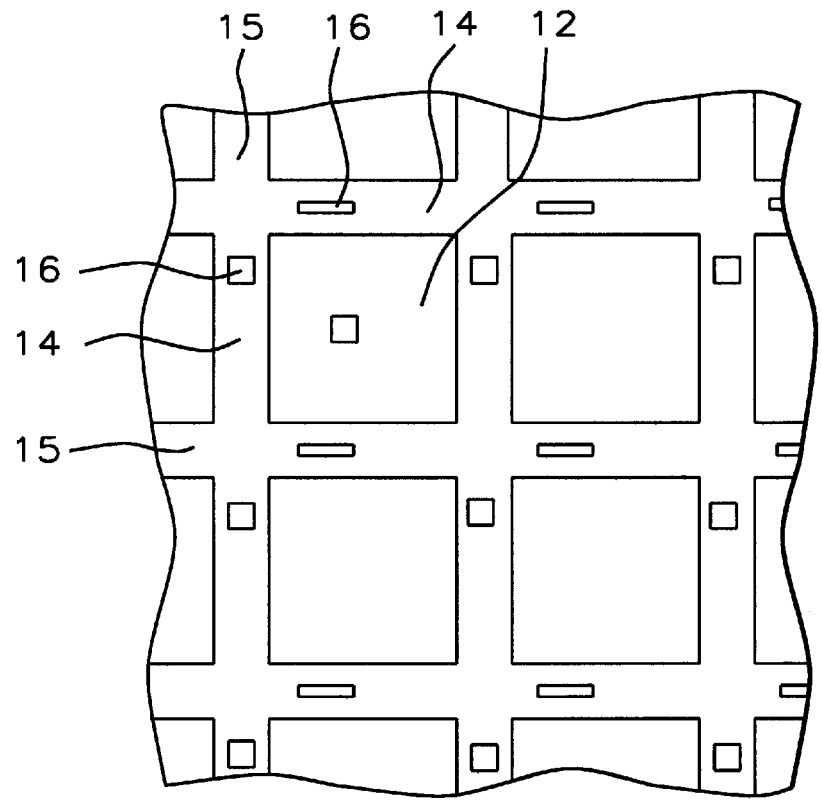
FIG. 1 shows a top view of a pattern formed on a wafer showing device regions, border regions, and frame cell regions.
Figure 2:
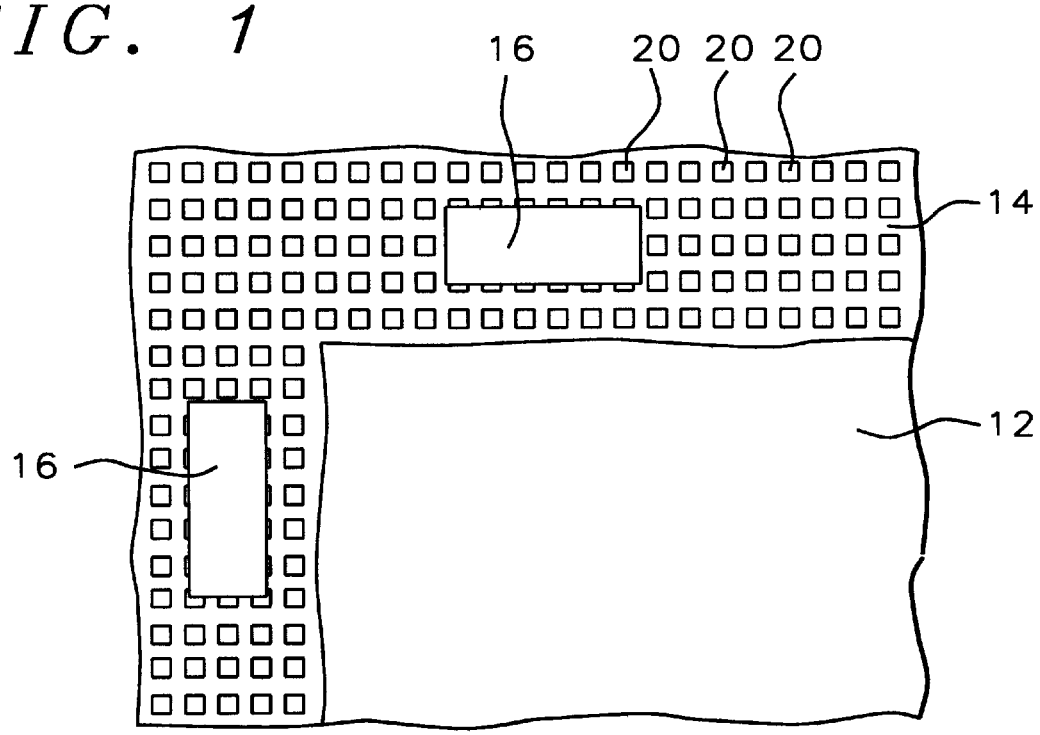
FIG. 2 shows a top view of a section of an attenuating phase shifting mask showing sub-resolution contact holes, border regions, and frame cell regions.
Figure 3:
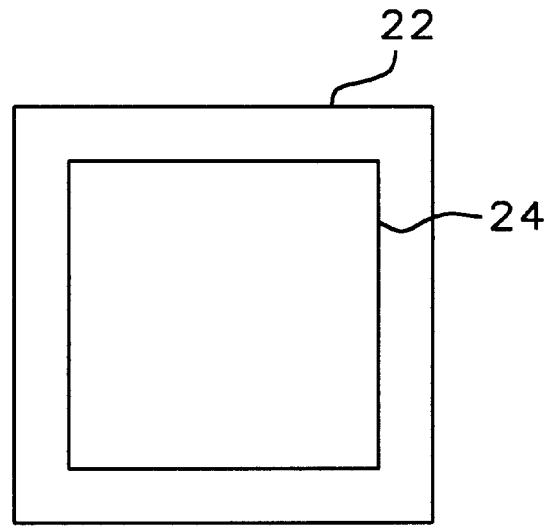
FIG. 3 shows a box in box test pattern.
Figure 4:
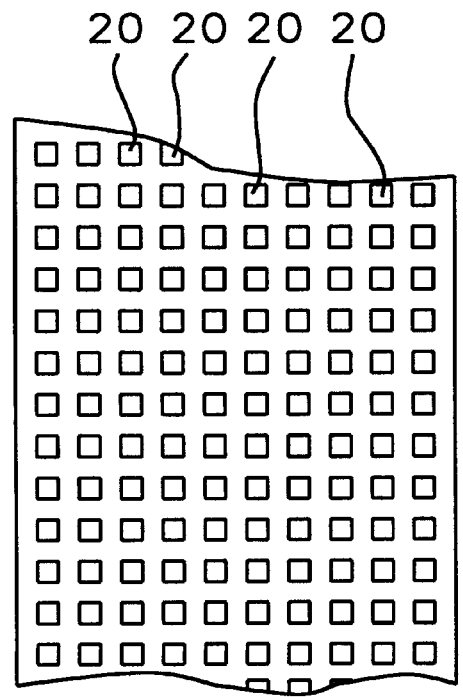
FIG. 4 shows a part of the array of sub-resolution contact holes used in the border region of the mask.
Figure 5:
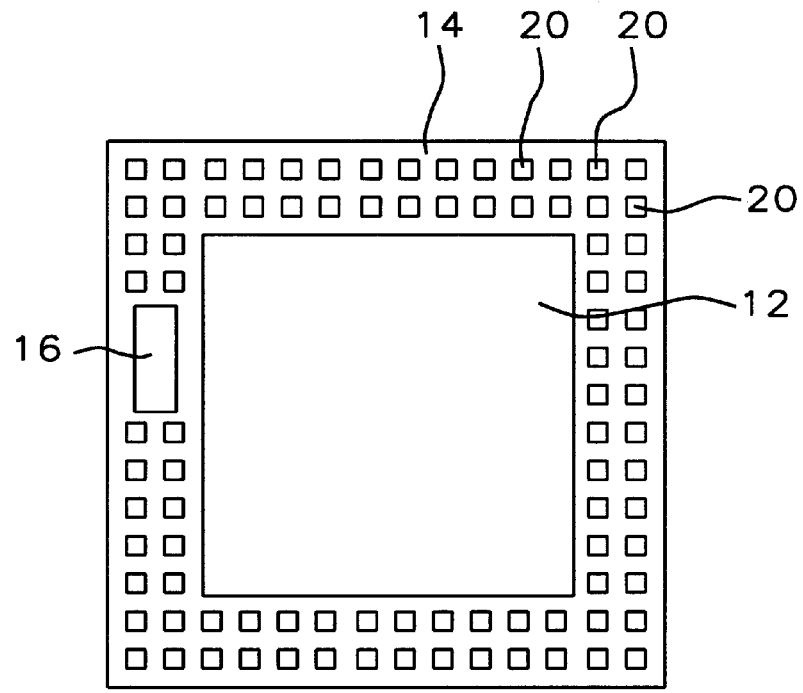
FIG. 5 shows a top view of the mask showing the device region, the border region, and the frame cell region.

Refer now to FIGS. 2–7 for a description of the preferred embodiments of this invention. FIG. 2 shows a top view of a part of a mask to be used in a stepper in forming a pattern on an integrated circuit wafer. FIG. 2 shows the device region 12, the border region 14 and the frame cell regions 16. FIG. 3 shows a test pattern to be located in the frame cell region. The test pattern in this example is a box in box pattern having an outer box 22 and an inner box 24 which is to be placed in the frame cell region 16 of the mask. The frame cell region is located in an array of sub-resolution contact holes 20, as shown in FIG. 4. As shown in FIG. 5, the border region 14, which is an array of sub-resolution contact holes 20, surrounds the device region 12. The frame cell region 16 is located in the border region 14.

Figure 6:
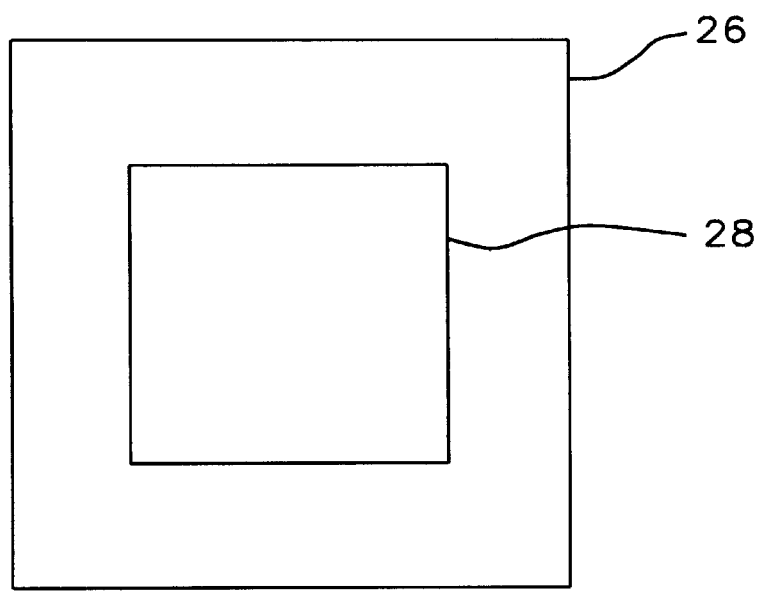
FIG. 6 shows a diagram of the perimeter of the buffer distance around the box in box pattern.
Figure 7:
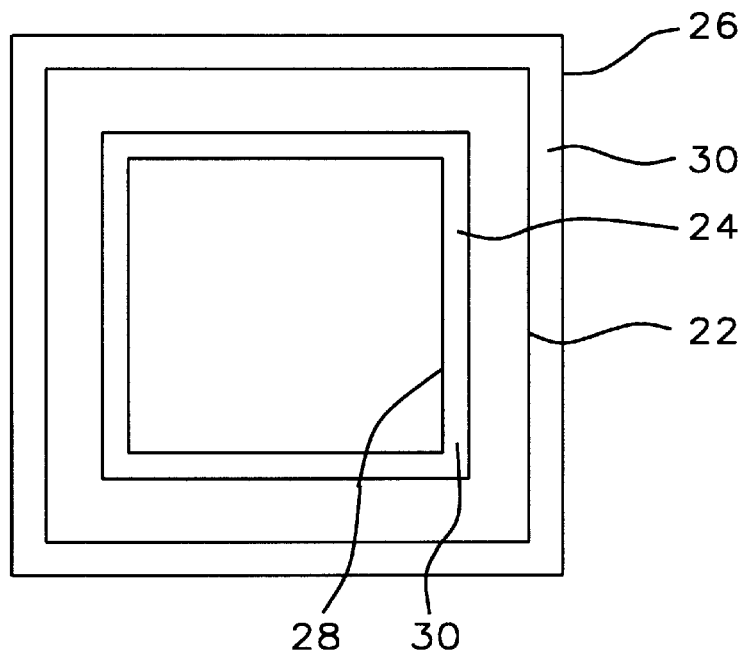
FIG. 7 shows the box in box pattern superimposed on the perimeter of the buffer distance around the box in box pattern.
Figure 8:
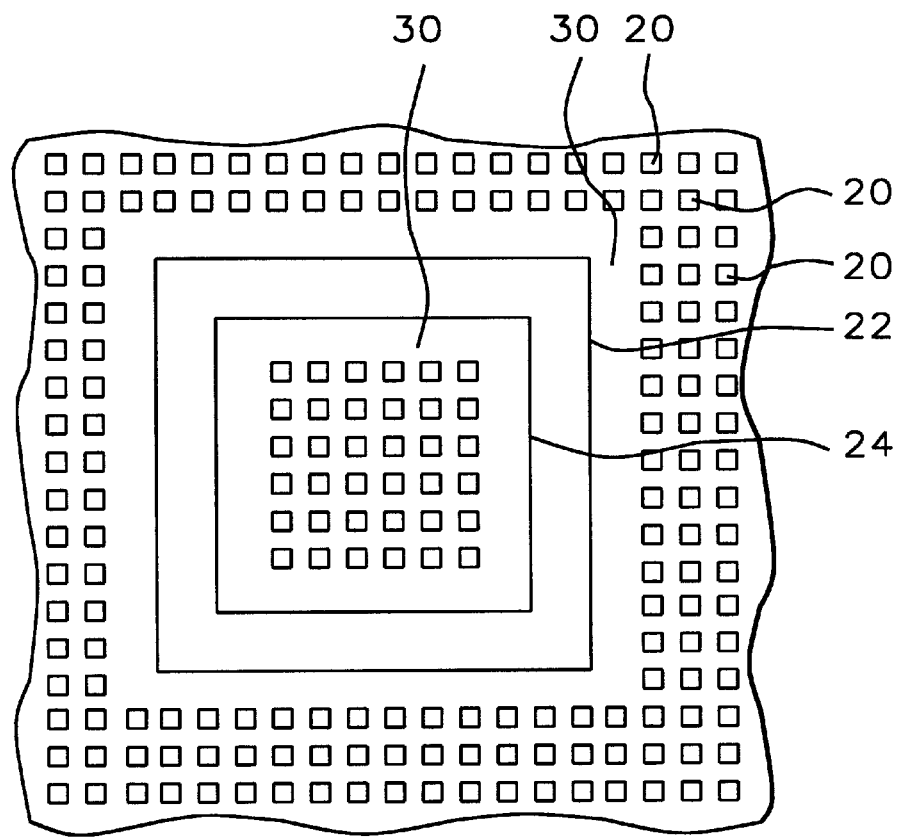
FIG. 8 shows a top view of the box in box pattern in a frame cell region with the buffer distance around the box in box pattern.

Next a buffer distance is established around the features of the test pattern, in this example the box in box pattern. The outer perimeter 26 and inner perimeter 28 of this buffer distance around the test pattern is shown in FIG. 6. To be most effective in maintaining the effectiveness of the sub-resolution contact array pattern the buffer distance, in this example, is between about 1.8 and 3.3 micrometers. FIG. 7 shows the inner perimeter 28 and the outer perimeter 26 of the buffer distance 30 from the inner perimeter 24 and outer perimeter 22 of the box in box pattern. There will be no sub-resolution contact holes in the region defined by the buffer distance 30. FIG. 8 shows the box in box pattern, 22 and 24, in a part of the frame cell region 16 with the buffer distance 30 shown around the outer perimeter 22 and inside the inner perimeter 30 of the box in box pattern.

The pattern of the frame cell 16 is generated automatically from the data used to generate the mask. The data matrix D, representing the device region of the mask, is subtracted from the data matrix A, which would provide an array of sub-resolution contact holes over the entire mask, and the result is a first intermediate data matrix. The first intermediate data matrix represents the border region completely filled with an array of sub-resolution contact holes. The data matrix B, representing the test pattern, is multiplied by a sizing matrix X, to provide for the buffer distance around the features of the test pattern, and the result is a second intermediate data matrix. The data matrix representing the frame cell with the test pattern is then the data matrix B, representing the test pattern, added to the data matrix resulting from subtracting the second data matrix from the first data matrix. This can be expressed as F=B+((A−D)−(B*X)) where B is the data matrix representing the test pattern, A is the data matrix representing an array of sub-resolution contact holes over the entire mask, D is the data matrix representing the device region, X is the sizing matrix, and F is the data matrix representing the frame cell with the test pattern.

Figure 9:
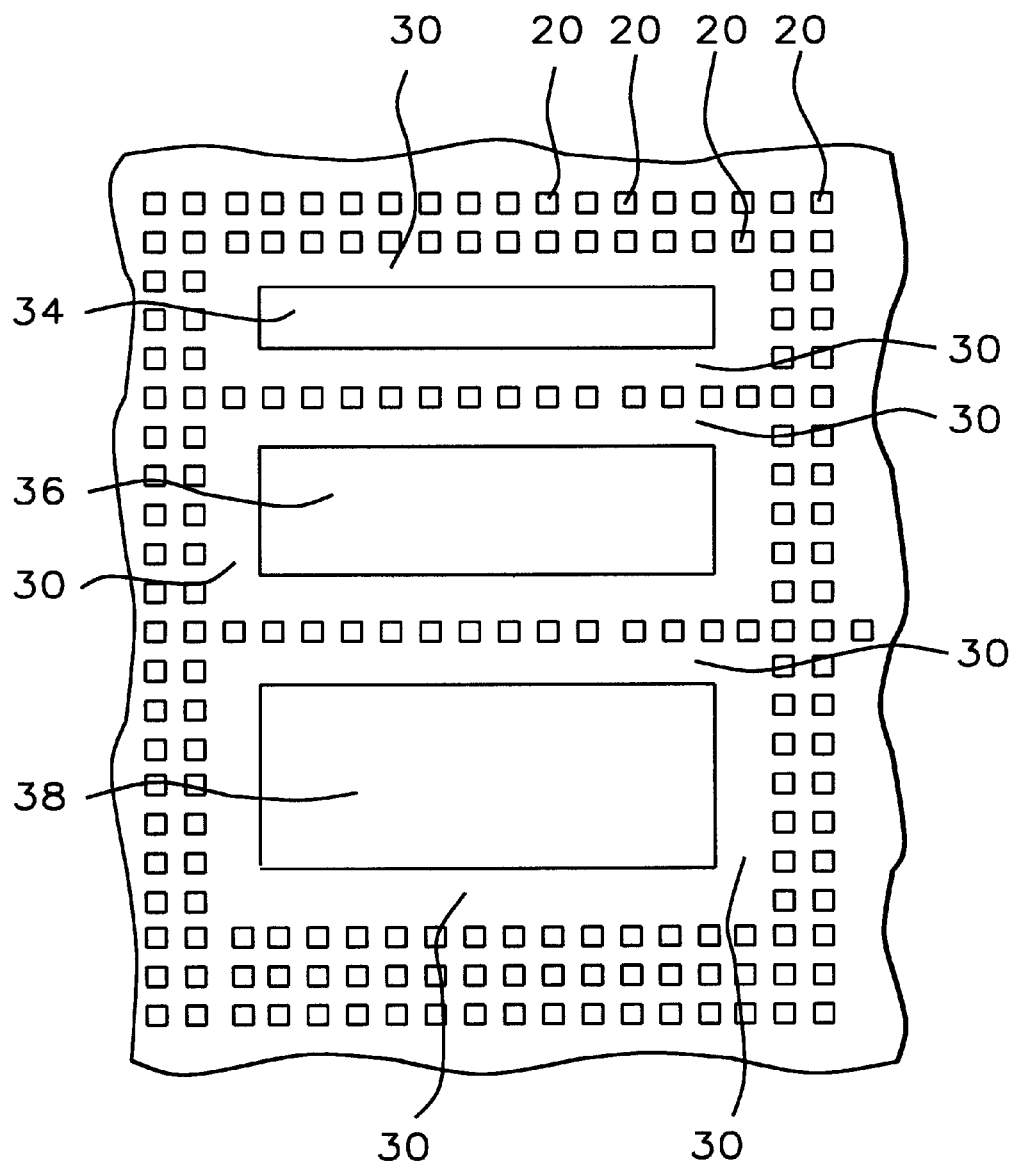
FIG. 9 shows a top view of a test line pattern in a frame cell region with the buffer distance around the test line pattern.
Figure 10:
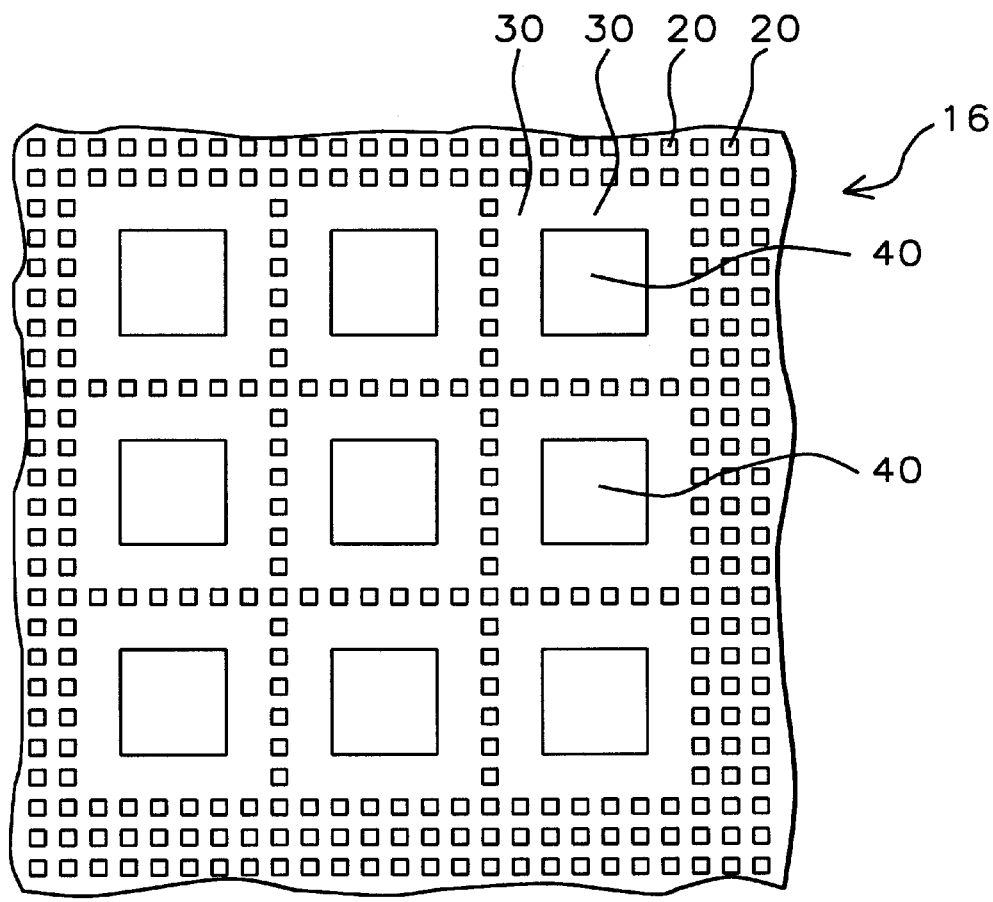
FIG. 10 shows a top view of a critical dimension pattern in a frame cell region with the buffer distance around the test line pattern.

Other examples of test patterns are shown in FIGS. 9 and 10. FIG. 9 shows a test line test pattern having three test lines, 34, 36, and 38 surrounded by a buffer distance 30 before beginning the pattern of sub-resolution contact holes 20. FIG. 10 shows a critical dimension test pattern having an array of shapes 40 representing critical dimensions each surrounded by a buffer distance 30 before beginning the pattern of sub-resolution contact holes 20. Alphanumeric patterns can also be placed in the frame cell region using this method.

While the invention has been particularly shown and described with reference to the preferred embodiments thereof, it will be understood by those skilled in the art that various changes in form and details may be made without departing from the spirit and scope of the invention.

What is claimed is:

1. A method of forming a frame cell pattern layout, comprising the steps of:

providing a mask pattern having a device region, a border region, and a frame cell region, wherein said frame cell region is located within said border region;

providing a test pattern;

providing a buffer distance around said test pattern;

providing an array of sub-resolution contact holes;

locating said test pattern within said frame cell region; and locating said array of sub-resolution contact holes in said border region so that said array of sub-resolution contact holes fills said border region except for the region occupied by said test pattern and said buffer distance around said test pattern.

2. The method of claim 1 wherein said mask pattern having a device region, a border region, and a frame cell region is used in an attenuating phase-shifting mask.

3. The method of claim 1 wherein said buffer distance is between about 1.8 and 3.3 micrometers.

4. The method of claim 1 wherein said test pattern is a box in box design.

5. The method of claim 1 wherein said test pattern is a test line pattern.

6. The method of claim 1 wherein said test pattern is a critical dimension bar.

7. A method of forming a mask pattern layout, comprising the steps of:

providing a mask pattern having a device region, a border region, and a frame cell region, wherein said frame cell region is located within said border region;

providing a test pattern;

providing a buffer distance around said test pattern;

providing a mask substrate;

providing masking materials comprising attenuating phase shifting material;

forming said mask pattern on said mask substrate using said masking materials;

forming said test pattern within said frame cell region using said masking materials; and forming an array of sub-resolution contact holes in said border region so that said array of sub-resolution contact holes fills said border region and said frame cell region except for the region occupied by said test pattern and said buffer distance around said test pattern, using said attenuating phase shifting material.

8. The method of claim 7 wherein said buffer distance is between about 1.8 and 3.3 micrometers.

9. The method of claim 7 wherein said test pattern is a box in box design.

10. The method of claim 7 wherein said test pattern is a test line pattern.

11. The method of claim 7 wherein said test pattern is a critical dimension bar.

12. The method of claim 7 wherein said attenuating phase shifting material is MoSiON.

13. The method of claim 7 wherein said mask substrate is a quartz substrate.

14. A mask pattern layout, comprising:

a mask substrate;

a mask pattern formed on said mask substrate using attenuating phase shifting material, wherein said mask pattern comprises a device region, a border region, and a frame cell region located within said border region;

a test pattern formed within said frame cell region;

a buffer distance around said test pattern; and an array of sub-resolution contact holes formed using said attenuating phase shifting material in said border region and said frame cell region so that said array of sub-resolution contact holes fills said border region and said frame cell region except for the region occupied by said test pattern and said buffer distance around said test pattern.

15. The mask pattern layout of claim 14 wherein said buffer distance is between about 1.8 and 3.3 micrometers.

16. The mask pattern layout of claim 14 wherein said test pattern is a box in box design.

17. The mask pattern layout of claim 14 wherein said test pattern is a test line pattern.

18. The mask pattern layout of claim 14 wherein said test pattern is a critical dimension bar.

19. The mask pattern layout of claim 14 wherein said attenuating phase shifting material is MoSiON.

20. The mask pattern layout of claim 14 wherein said mask substrate is a quartz substrate.

* * * * *